(12) United States Patent
Yoshimura et al.

(10) Patent No.: US 8,901,591 B2
(45) Date of Patent: *Dec. 2, 2014

(54) LIGHT-EMITTING DEVICE

(75) Inventors: Kenichi Yoshimura, Osaka (JP); Kohsei Takahashi, Osaka (JP); Hiroshi Fukunaga, Osaka (JP); Naoto Hirosaki, Tsukuba (JP)

(73) Assignees: Sharp Kabushiki Kaisha, Osaka (JP); National Institute for Materials Science, Ibaraki (JP)

( * ) Notice: Subject to any disclaimer, the term of this patent is extended or adjusted under 35 U.S.C. 154(b) by 24 days.

This patent is subject to a terminal disclaimer.

(21) Appl. No.: 13/811,933

(22) PCT Filed: Jul. 15, 2011

(86) PCT No.: PCT/JP2011/066226
§ 371 (c)(1),
(2), (4) Date: Feb. 21, 2013

(87) PCT Pub. No.: WO2012/014701
PCT Pub. Date: Feb. 2, 2012

(65) Prior Publication Data
US 2013/0277698 A1   Oct. 24, 2013

(30) Foreign Application Priority Data
Jul. 26, 2010   (JP) ................. 2010-167065

(51) Int. Cl.
*H01L 33/50* (2010.01)
*C09K 11/08* (2006.01)
*C09K 11/77* (2006.01)
*H05B 33/14* (2006.01)

(52) U.S. Cl.
CPC .......... *H01L 33/504* (2013.01); *C09K 11/0883* (2013.01); *H01L 33/502* (2013.01); *C09K 11/7715* (2013.01); *Y02B 20/181* (2013.01); *H05B 33/14* (2013.01)
USPC ............................. 257/98; 438/29

(58) Field of Classification Search
CPC ............. H01L 33/504; C09K 11/0883; C09K 11/7715; H05B 33/14
USPC .............................................. 257/98; 438/29
See application file for complete search history.

(56) References Cited

U.S. PATENT DOCUMENTS 8,038,905 B2 * 10/2011 Mueller-Mach et al. .. 252/301.4 F
2004/0135504 A1   7/2004 Tamaki et al.
(Continued)

FOREIGN PATENT DOCUMENTS

JP   2003-321675 A   11/2003
JP   2005-255895 A   9/2005
(Continued)

OTHER PUBLICATIONS

Official Communication issued in International Patent Application No. PCT/JP2011/066230, mailed on Oct. 25, 2011.
(Continued)

Primary Examiner — Allan R Wilson
(74) Attorney, Agent, or Firm — Keating & Bennett, LLP

(57) ABSTRACT

There is realized a light-emitting device that emits, with high efficiency, white light with excellent color rendering index. A light-emitting device (1) of the present invention is a light-emitting device (1) for emitting white light, including at least a light-emitting element (2) for emitting blue light, an orange fluorescent material (13) which absorbs the blue light so as to emit orange light, and a green fluorescent material (14) which absorbs the blue light so as to emit green light, the orange fluorescent material (13) being a Ce-activated $CaAlSiN_3$ fluorescent material in a solid solution crystal form in which Ce and oxygen are dissolved in a crystal having a composition of $cCaAlSiN_3 \cdot (1-c)LiSi_2N_3$ where $0.2 \leq c \leq 0.8$, and the orange fluorescent material (13) containing 2 weight % or more of Ce.

9 Claims, 8 Drawing Sheets

(56) References Cited

U.S. PATENT DOCUMENTS

| | | |
|---|---|---|
| 2006/0038477 A1 | 2/2006 | Tamaki et al. |
| 2006/0091790 A1 | 5/2006 | Nagatomi et al. |
| 2007/0007494 A1 | 1/2007 | Hirosaki et al. |
| 2007/0108896 A1 | 5/2007 | Hirosaki |
| 2007/0194695 A1 | 8/2007 | Yoon et al. |
| 2008/0089825 A1 | 4/2008 | Tamaki et al. |
| 2008/0128735 A1 | 6/2008 | Yoo et al. |
| 2008/0197321 A1 | 8/2008 | Hirosaki et al. |
| 2008/0258602 A1 | 10/2008 | Masuda et al. |
| 2009/0033201 A1 | 2/2009 | Shimooka et al. |
| 2009/0066230 A1 | 3/2009 | Hirosaki et al. |
| 2009/0072708 A1 | 3/2009 | Tamaki et al. |
| 2009/0079327 A1 | 3/2009 | Daicho et al. |
| 2009/0129052 A1 | 5/2009 | Hirosaki |
| 2009/0153028 A1 | 6/2009 | Hirosaki |
| 2009/0166584 A1 | 7/2009 | Shimooka et al. |
| 2009/0230840 A1 | 9/2009 | Tamaki et al. |
| 2009/0284132 A1 | 11/2009 | Tamaki et al. |
| 2009/0309485 A1 | 12/2009 | Tamaki et al. |
| 2010/0038590 A1 | 2/2010 | Suzuki et al. |
| 2010/0053932 A1 | 3/2010 | Emoto et al. |
| 2010/0085728 A1 | 4/2010 | Seto et al. |
| 2010/0133563 A1 | 6/2010 | Schmidt et al. |
| 2010/0283381 A1 | 11/2010 | Takahashi et al. |
| 2011/0007228 A1 | 1/2011 | Yoon et al. |
| 2012/0019127 A1 | 1/2012 | Hirosaki |
| 2012/0104448 A1 | 5/2012 | Yoshimura et al. |
| 2012/0262648 A1 | 10/2012 | Hirosaki et al. |
| 2012/0319155 A1 | 12/2012 | Yoshimura et al. |
| 2013/0207146 A1* | 8/2013 | Yoshimura et al. ............ 257/98 |
| 2013/0328478 A1* | 12/2013 | Emoto, Hideyuki .......... 313/503 |

FOREIGN PATENT DOCUMENTS

| | | |
|---|---|---|
| JP | 2006-008721 A | 1/2006 |
| JP | 2006-206729 A | 8/2006 |
| JP | 2007-180483 A | 7/2007 |
| JP | 2007-227928 A | 9/2007 |
| JP | 2007-231245 A | 9/2007 |
| JP | 2008-127509 A | 6/2008 |
| JP | 2008-127547 A | 6/2008 |
| JP | 2008-138156 A | 6/2008 |
| JP | 2008-147190 A | 6/2008 |
| JP | 2008-530334 A | 8/2008 |
| JP | 2008-244468 A | 10/2008 |
| JP | 2008-244469 A | 10/2008 |
| JP | 2008-303331 A | 12/2008 |
| JP | 2009-073914 A | 4/2009 |
| JP | 3150457 U | 5/2009 |
| WO | 2006/126567 A1 | 11/2006 |
| WO | 2008/062781 A1 | 5/2008 |
| WO | 2010/018999 A2 | 2/2010 |
| WO | 2010/110457 A1 | 9/2010 |
| WO | 2011/002087 A1 | 1/2011 |

OTHER PUBLICATIONS

Official Communication issued in International Patent Application No. PCT/JP2011/066226, mailed on Oct. 25, 2011.

Official Communication issued in International Patent Application No. PCT/JP2010/061345, mailed on Aug. 3, 2010.

Official Communication issued in International Patent Application No. PCT/JP2011/051600, mailed on Mar. 1, 2011.

Xie et al., "Silicon-Based Oxynitride and Nitride Phosphors for White LEDs—A Review," Science and Technology of Advanced Materials 8, 2007, pp. 588-600, Oct. 23, 2007.

Yoshimura et al., "Light-Emitting Device," , U.S. Appl. No. 13/811,996, filed Jan. 24, 2013.

Yoshimura et al., "Light-Emitting Device," U.S. Appl. No. 13/381,348, filed Dec. 28, 2011.

Yoshimura et al., "Light-Emitting Device," U.S. Appl. No. 13/580,791, filed Aug. 23, 2012.

* cited by examiner

LIGHT-EMITTING DEVICE

TECHNICAL FIELD

The present invention relates to a light-emitting device including a fluorescent material.

BACKGROUND ART

A semiconductor light-emitting element such as a light-emitting diode (LED) has advantageous features of (i) being small in size, (ii) consuming less electric power, and (iii) stably emitting light with high luminance. In recent years, there has been tendency to replace a lighting apparatus such as an incandescent lamp with a lighting apparatus including a light-emitting device made up of an LED that emits white light.

An example of the LED that emits white light is one in which a blue LED is combined with a Ce-activated YAG fluorescent material expressed by a composition formula $(Y,Gd)_3(Al,Ga)_5O_{12}$:Ce.

In the light-emitting device thus configured, white light is obtained by mixing blue light emitted by the blue LED and yellow light emitted by the Ce-activated YAG fluorescent material. In this configuration, the Ce-activated YAG fluorescent material is excited highly efficiently in a wavelength range between 440 nm and 470 nm, in which the blue LED emits light highly efficiently. This allows the light-emitting device itself to emit light with high efficiency.

However, the Ce-activated YAG fluorescent material has narrow full width at half maximum of emission spectrum, and this leads to lack of a red component of the light-emitting device. Therefore, in a case where the light-emitting device is employed as a household lighting apparatus etc., there occurs a problem such as that the human skin color looks unnatural.

Specifically, the light-emitting device has an average color rendering index (Ra) of approximately 70, in a color temperature range defined by neutral white and lamp color used in lighting apparatuses. In particular, the light-emitting device has a special color rendering index (R9) of approximately −40, which indicates how red looks. These indexes show that, in a case where the light-emitting device is employed as a lighting apparatus, red will look extremely improperly. Note that "Ra" is an index indicating how faithfully test light reproduces a test color, where a color seen under reference light is indicated by 100. In particular, "R9" is the special color rendering index for red.

In recent years, a configuration for improving Ra and R9 of white light from a semiconductor light-emitting device has been proposed (for example, see Patent Literature 1). In the configuration, a red fluorescent material such as a nitride fluorescent material is further incorporated with the blue LED and the yellow fluorescent material such as the Ce-activated YAG fluorescent material so that the narrow full width at half maximum of emission spectrum of the Ce-activated YAG fluorescent material is compensated by red light emitted by the red fluorescent material. This enhances uniformity of the emission spectrum of the fluorescent materials, and accordingly Ra and R9 of white light emitted by the semiconductor light-emitting device are improved.

Further, in recent years, a fluorescent material has been proposed which is made up of, as host crystal, $CaAlSiN_3$ crystal containing at least Li, Ca, Si, Al, O, N, and Ce (for example, see Patent Literature 2). It is disclosed that the fluorescent material is suitably used to provide a white LED by being combined with a blue LED.

CITATION LIST

Patent Literatures

[Patent Literature 1]
Japanese Patent Application Publication Tokukai No. 2003-321675 A (Publication date: Nov. 14, 2003)
[Patent Literature 2]
WO 2010/110457 A1 (Publication date: Sep. 30, 2010)

SUMMARY OF INVENTION

Technical Problem

However, the configuration disclosed in Patent Literature 1 has a problem that light emitting efficiency of the light-emitting device is considerably low. Specifically, according to the configuration disclosed in Patent Literature 1, the red fluorescent material absorbs the yellow light emitted by the yellow fluorescent material, and this considerably decreases the light emitting efficiency of the light-emitting device.

According to the fluorescent material disclosed in Patent Literature 2, a suitable Ce content for exciting the blue LED is not specified, and therefore the fluorescent material of Patent Literature 2 is not configured to be excited highly efficiently in the wavelength range between 440 nm and 470 nm, in which the blue LED emits light highly efficiently. It is therefore impossible to emit, with high efficiency, white light with an excellent color rendering property.

The present invention was made in view of the foregoing problems. An object of the present invention is to realize a light-emitting device that emits, with high efficiency, white light with excellent color rendering index.

Solution to Problem

In order to provide a light-emitting device that achieves high color rendering index with emitted light and that exhibits high luminous efficiency as described above, the inventors of the present invention have repeatedly manufactured by way of trial a fluorescent material and a light-emitting device including the fluorescent material and a semiconductor light-emitting element. As a result, the inventors of the present invention have found that a combination of members mentioned below could provide a light-emitting device that solves the foregoing problems, and completed the present invention. The following will describe the present invention in detail.

In order to solve the foregoing problem, a light-emitting device of the present invention is a light-emitting device for emitting white light, including at least a light-emitting element for emitting blue light, an orange fluorescent material which absorbs the blue light so as to emit orange light, and a green fluorescent material which absorbs the blue light so as to emit green light, the orange fluorescent material being a Ce-activated $CaAlSiN_3$ fluorescent material in a solid solution crystal form in which Ce and oxygen are dissolved in a crystal having a composition of $cCaAlSiN_3 \cdot (1-c)LiSi_2N_3$ where $0.2 \leq c \leq 0.8$, and the orange fluorescent material containing 2 weight % or more of Ce.

With arrangement, the orange fluorescent material is excited with high efficiency in a wavelength region of 440 nm to 470 nm where full width at half maximum of emission spectrum of the orange fluorescent material is broad and a light-emitting element such as LED that emits blue light exhibits high luminous efficiency in general. Accordingly, it is possible to realize a light-emitting device that emits, with high luminous efficiency, white light with high Ra and R9. Therefore, it is possible to provide a light-emitting device that emits, with high efficiency, white light with excellent color rendering index.

Advantageous Effects of Invention

As described above, the light-emitting device of the present invention is a light-emitting device for emitting white light, including at least a light-emitting element for emitting blue light, an orange fluorescent material which absorbs the blue light so as to emit orange light, and a green fluorescent material which absorbs the blue light so as to emit green light, the orange fluorescent material being a Ce-activated $CaAlSiN_3$ fluorescent material in a solid solution crystal form in which Ce and oxygen are dissolved in a crystal having a composition of $cCaAlSiN_3.(1-c)LiSi_2N_3$ where $0.2 \leq c \leq 0.8$, and the orange fluorescent material containing 2 weight % or more of Ce.

Accordingly, it is possible to provide a light-emitting device that emits, with high efficiency, white light with excellent color rendering index.

DESCRIPTION OF EMBODIMENTS

The following describes an embodiment of the present invention. It should be noted that in the specification, the expression "A-B" used to indicate a range indicates being not less than A and not more than B. Physical properties mentioned in the specification were obtained by methods described in later-mentioned Examples, unless otherwise stated.

Figure 1:
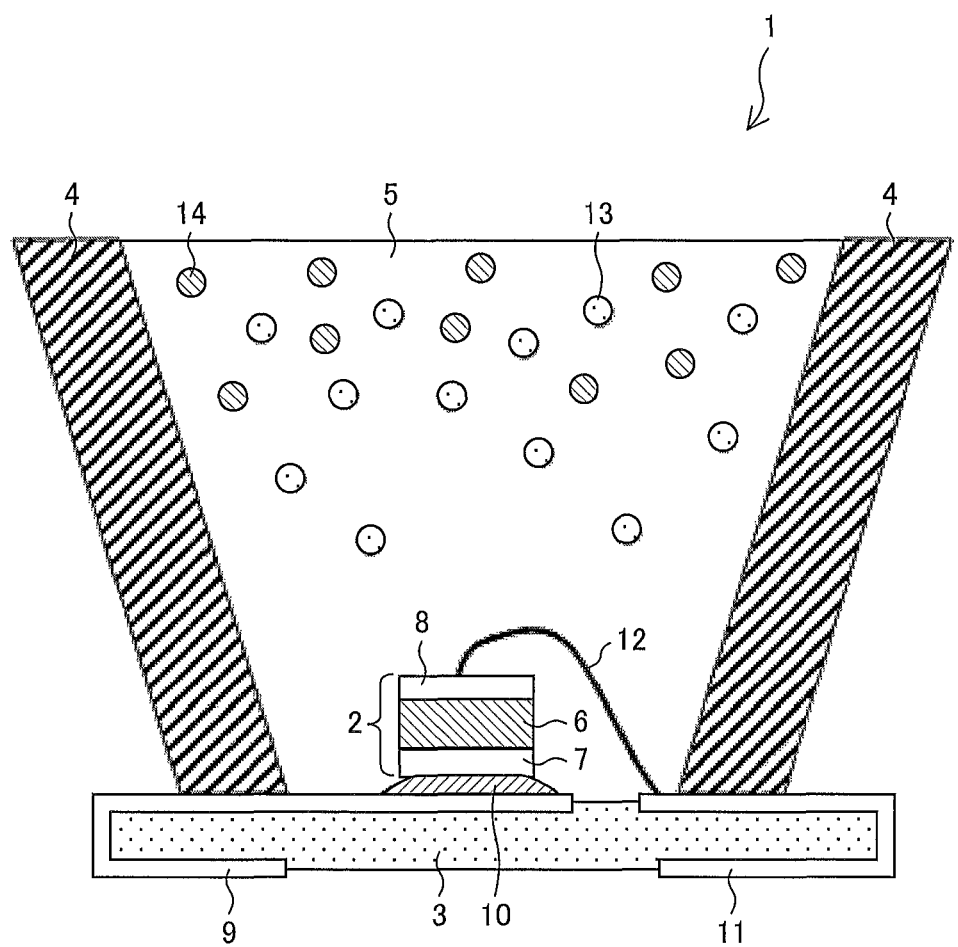
FIG. 1 is a cross sectional view schematically showing a configuration of a light-emitting device in accordance with the present embodiment.

FIG. 1 is a cross sectional view schematically showing a configuration of a light-emitting device in accordance with the present embodiment.

A light-emitting device 1 in accordance with the present embodiment is a light-emitting device 1 for emitting white light, including at least a semiconductor light-emitting element 2 for emitting blue light, an orange fluorescent material 13 which absorbs the blue light so as to emit orange light, and a green fluorescent material 14 which absorbs the blue light so as to emit green light.

The orange fluorescent material 13 is a Ce-activated $CaAlSiN_3$ fluorescent material in a solid solution crystal form in which Ce and oxygen are dissolved in a crystal having a composition of $cCaAlSiN_3.(1-c)LiSi_2N_3$ where $0.2 \leq c \leq 0.8$, and the orange fluorescent material 13 contains 2 weight % or more of Ce.

In the specification, "blue light" indicates light whose peak of emission spectrum is 420-480 nm in wavelength. "Green light" indicates light whose peak of emission spectrum is 500-550 nm in wavelength. "Orange light" indicates light whose peak of emission spectrum is 570-630 nm in wavelength. "White light" indicates light whose chromaticity point falls within one of ranges of "daylight", "neutral white", "white", "warm white", and "lamp color" defined under JIS Z9112.

"Green fluorescent material" is a material that is excited by the blue light to emit the green light. "Orange fluorescent material" is a material that emits the orange light.

The light-emitting device 1 in accordance with the present embodiment is designed such that the semiconductor light-emitting element 2 is provided on a printed wiring substrate 3 serving as a substrate, and a resin frame 4 on the printed wiring substrate 3 is filled with a mold resin 5 made up of translucent resin in which at least the orange fluorescent material 13 and the green fluorescent material 14 are dispersed, so that the semiconductor light-emitting element 2 is sealed.

The state where the orange fluorescent material 13 and the green fluorescent material 14 are dispersed is not particularly limited. However, in consideration of preventing the fluorescent materials from absorbing light from each other, it is preferable that a more amount of the orange fluorescent material 13 is dispersed in the vicinity of the semiconductor light-emitting element 2 than the green fluorescent material 14 is.

The semiconductor light-emitting element 2 includes (i) an InGaN layer 6 as an active layer and (ii) a p-side electrode 7 and an n-side electrode 8 with the InGaN layer 6 therebetween. The n-side electrode 8 is electrically connected via a conductive adhesive 10 with an n-electrode section 9 provided on the printed wiring substrate 3 from an upper surface thereof to a back surface thereof. The p-side electrode 7 is electrically connected via a metal wire 12 with a p-electrode section 11 which is provided, separately from the n-electrode section 9, on the printed wiring substrate 3 from an upper surface thereof to a back surface thereof.

(I) Light-Emitting Element

In the present embodiment, the semiconductor light-emitting element 2 is used as a light-emitting element, and the semiconductor light-emitting element 2 is a light emitting diode (LED). However, the semiconductor light-emitting element 2 is not limited to a light emitting diode (LED), and may be conventional and publicly known elements that emit blue light, such as semiconductor laser and inorganic EL (electroluminescence) element. The LED may be a commercially available one manufactured by Cree, Inc. for example.

Emission peak wavelength of the semiconductor light-emitting element 2 is not particularly limited, but preferably 440-470 nm in consideration of luminous efficiency. The emission peak wavelength is more preferably in a range of not less than 455 nm and not more than 470 nm in consideration of increasing excitation efficiency of the fluorescent material and increasing Ra and R9 of light emitted from the light-emitting device.

(II) Orange Fluorescent Material

The orange fluorescent material 13 is a Ce-activated CaAlSiN$_3$ fluorescent material in a solid solution crystal form in which Ce and oxygen are dissolved in a crystal having a composition of cCaAlSiN$_3$.(1−c)LiSi$_2$N$_3$ where $0.2 \leq c \leq 0.8$, and contains Ce in a range of 2 weight % or more.

In order that the Ce-activated CaAlSiN$_3$ fluorescent material is in a solid solution crystal form in which Ce and oxygen are dissolved in a crystal having the above composition, it is necessary to incorporate, for example, at least one kind of oxide of a constitutional metal element such as CeO$_2$ into a raw material powder.

With the arrangement, the orange fluorescent material 13 is excited with high efficiency in a wavelength region of 440-470 nm where full width at half maximum of emission spectrum of the orange fluorescent material 13 is broad and luminous efficiency of blue LED is high. This allows realizing a light-emitting device capable of emitting, with high luminous efficiency, white light whose Ra and R9 are high.

Furthermore, it is preferable to arrange the orange fluorescent material 13 such that its excitation wavelength indicative of the maximum value of inner quantum efficiency is in a range of 440-470 nm. This arrangement allows realizing a light-emitting device that emits, with higher luminous efficiency, white light with higher color rendering index.

When the light-emitting device 1 in accordance with the present embodiment is used for a lighting apparatus etc., it is necessary to flow a large amount of a current compared with when the light-emitting device 1 is used for an indicator etc., and ambient temperature of the semiconductor light-emitting element 2 reaches as high as 100-150° C. For example, as disclosed in Japanese Patent Application Publication No. 2008-127529, under a high temperature circumstance where ambient temperature is 150° C., a YAG:Ce fluorescent material described in Japanese Patent Application Publication No. 2003-321675 drops its emission intensity down to 50% of emission intensity at a room temperature. In contrast to such a conventional fluorescent material, an oxynitride fluorescent material described in the present specification has excellent emission properties under a high temperature circumstance in particular, and as described in Non-patent Literature (Science and Technology of Advanced Materials 8 (2007) 588-600), under a high temperature circumstance where ambient temperature is 100-150° C., the oxynitride fluorescent material can maintain emission intensity of approximately 85-90% of emission intensity at a room temperature.

It is preferable that a fluorescent material included in the light-emitting device 1 in accordance with the present embodiment has emission properties under high temperature circumstance similar to those of the fluorescent material described in the above Non-patent Literature. In consideration of this, it is preferable that Ce concentration in the orange fluorescent material 13 in which Ce and oxygen are dissolved is not more than 6 weight %.

Furthermore, it is preferable that Li concentration in the orange fluorescent material 13 is not more than 4 weight % in consideration of luminous efficiency.

Furthermore, in consideration of broadening full width at half maximum of emission spectrum, it is preferable that Li concentration in the orange fluorescent material 13 is not less than 1.5 weight %. In the light-emitting device 1 in accordance with the present embodiment, as the full width at half maximum of emission spectrum of the orange fluorescent material 13 is broader, light emitted from the light-emitting device has higher color rendering index and the light-emitting device has higher luminous efficiency. Specifically, it is preferable that full width at half maximum of emission spectrum of the orange fluorescent material 13 is not less than 120 nm. Furthermore, it is preferable that the full width at half maximum is not more than 150 nm.

Particle size of the orange fluorescent material 13 is preferably 1-50 μm, and more preferably 5-20 μm. The shape of a particle is preferably a single particle, not agglomerate. Specifically, specific surface area of the particle is preferably not more than 1 m$^2$/g, and more preferably not more than 0.4 m$^2$/g. For such particle size control and particle shape control, techniques such as mechanical pulverization, removal of grain boundary phase by acid treatment, and annealing treatment can be used appropriately.

Figure 2:
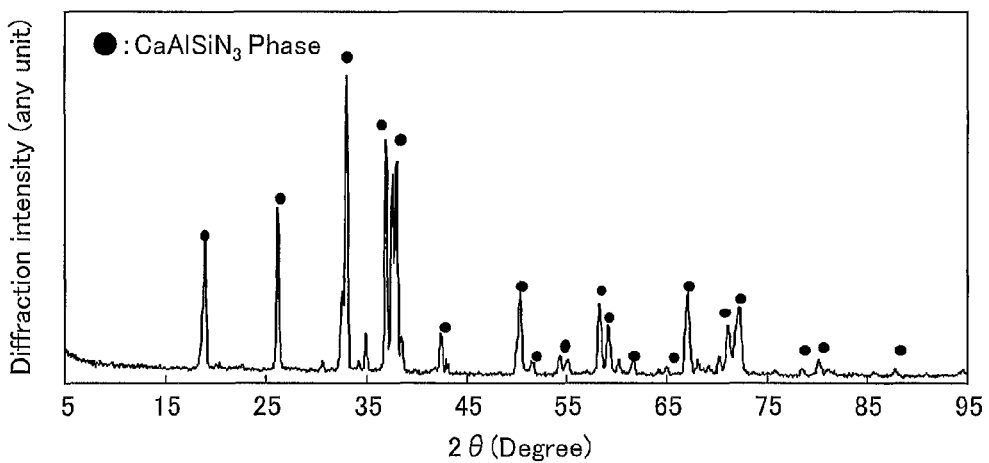
FIG. 2 is a graph showing a result of XRD measurement of a fluorescent material powder obtained in Production Example 1-1.

A light-emitting device obtained by combining a Ce-activated CaAlSiN$_3$ fluorescent material with a green fluorescent material is also disclosed in Patent Literature 2 (Japanese Patent Application Publication No. 2008-530334), and FIG. 2 of Patent Literature 2 shows excitation spectrum of the Ce-activated CaAlSiN$_3$ fluorescent material. However, the present invention having the above configuration is different from the invention disclosed in Patent Literature 2.

Specifically, peak wavelength of emission spectrum of the Ce-activated CaAlSiN$_3$ fluorescent material disclosed in Patent Literature 2 is 615 nm, which is in the range of long wavelength compared with that of the Ce-activated CaAlSiN$_3$ fluorescent material in accordance with the present embodiment. Therefore, in a case where a light-emitting device includes the Ce-activated CaAlSiN$_3$ fluorescent material described in Patent Literature 2, a part of light emitted from the light-emitting device is out of visibility of human, so that luminous efficiency of the light-emitting device drops extremely.

In contrast, the light-emitting device of the present invention includes the orange fluorescent material 13 having emission properties and absorption properties that are suitable when combined with a blue LED. In particular, the inventors of the present invention have found that specifically, a preferable example of the Ce-activated $CaAlSiN_3$ fluorescent material for realizing optimal emission properties and absorption properties is an orange fluorescent material in a solid solution crystal form in which Ce and oxygen are dissolved in a crystal having a composition of $cCaAlSiN_3.(1-c)LiSi_2N_3$ where $0.2 \leq c \leq 0.8$ and which contains 2 weight % or more of Ce. This allows realizing a light-emitting device that emits, with high efficiency, white light with high color rendering index.

(III) Green Fluorescent Material

The light-emitting device 1 in accordance with the present embodiment includes, as a fluorescent material, a green fluorescent material 14 in addition to the orange fluorescent material 13.

It is preferable that full width at half maximum of emission spectrum of the green fluorescent material 14 is narrower than that of the orange fluorescent material 13. Specifically, full width at half maximum of emission spectrum of the green fluorescent material 14 is preferably not more than 70 nm, and more preferably not more than 55 nm. Furthermore, although the lower limit of the full width at half maximum of emission spectrum of the green fluorescent material 14 is not particularly limited, the lower limit is preferably not less than 15 nm and more preferably not less than 40 nm.

When the full width at half maximum of emission spectrum of the green fluorescent material 14 is within the above range, absorption of green light by the orange fluorescent material 13 is subdued, so that a light-emitting device having further higher luminous efficiency can be realized.

The green fluorescent material 14 is not particularly limited as long as it meets the above requirements. A preferable example of the green fluorescent material 14 is an Eu-activated oxynitride fluorescent material because of its high stability and excellent temperature characteristics.

Furthermore, preferable examples of the Eu-activated oxynitride fluorescent material include an Eu-activated BSON fluorescent material described in Japanese Patent Application Publication No. 2008-138156 and an Eu-activated β sialon fluorescent material described in Japanese Patent Application Publication No. 2005-255895 that have excellent luminous efficiency. Among them, the Eu-activated β sialon fluorescent material in particular has excellent stability and temperature characteristics, and has particularly narrow full width at half maximum of emission spectrum, exhibiting excellent luminous characteristics.

Specifically, the Eu-activated BSON fluorescent material is preferably a fluorescent material having a composition of $Ba_{y'}, Eu_{x'}, Si_{u'}, O_{v'}, N_{w'}$ where $0 \leq y' \leq 3$, $1.6 \leq y'+x' \leq 3$, $5 \leq u' \leq 7$, $9 < v' < 15$, $0 < w' \leq 4$. More preferable ranges of y', x', u', v', and w' are that $1.5 \leq y' \leq 3$, $2 \leq y'+x' \leq 3$, $5.5 \leq u' \leq 7$, $10 < v' < 13$, $1.5 < w' \leq 4$.

Specifically, the Eu-activated β sialon fluorescent material is preferably a fluorescent material having a composition of $Si_{6-z'}, Al_{z'}, O_{z'}, N_{8-z'}$ where $0 < z' < 4.2$ and activated with Eu. A more preferable range of z' is $0 < z' < 0.5$.

It is preferable to arrange the Eu-activated β sialon fluorescent material such that its oxygen concentration is 0.1-0.6 weight % and its Al concentration is 0.13-0.8 weight %. When oxygen concentration and Al concentration of the Eu-activated β sialon fluorescent material are within the above ranges, full width at half maximum of emission spectrum is likely to be narrower.

The Eu-activated β sialon fluorescent material disclosed in International Publication WO2008/062781 has removed a damage phase of the fluorescent material by an after-treatment such as an acid treatment after sintering, and accordingly has little unnecessary absorption and high luminous efficiency. Furthermore, the Eu-activated β sialon fluorescent material disclosed in Japanese Patent Application Publication No. 2008-303331 has oxygen concentration of 0.1-0.6 weight %, and accordingly has narrow full width at half maximum of emission spectrum, which is preferable.

To be more specific, a preferable example of the green fluorescent material 14 is one in which an absorption ratio of light at 600 nm which is a wavelength region not contributing to light emission of a β sialon fluorescent material and is close to a peak wavelength of the orange fluorescent material is not more than 10%.

The particle size of the green fluorescent material 14 is preferably 1-50 μm, and more preferably 5-20 μm. The shape of a particle is preferably a single particle, not agglomerate. Specifically, specific surface area of the particle is preferably not more than 1 $m^2/g$, and more preferably not more than 0.4 $m^2/g$. For such particle size control and particle shape control, techniques such as mechanical pulverization, removal of grain boundary phase by acid treatment, and annealing treatment can be used appropriately.

In a case where the green fluorescent material 14 used in the present embodiment is an Eu-activated oxynitride fluorescent material, both of the orange fluorescent material 13 and the green fluorescent material 14 are nitrides and accordingly have similar temperature-dependency, specific gravity, particle size etc. Therefore, the light-emitting device 1 with the above configuration can be manufactured with good yield, and the light-emitting device has high reliability hardly influenced by ambient environment. In addition, since the nitride fluorescent material has strong covalent bonding of host crystals, the nitride fluorescent material has little temperature-dependency in particular and is highly resistant to chemical and physical damages.

(IV) Mold Resin

In the light-emitting device 1, the mold resin 5 used for sealing the semiconductor light-emitting element 2 is obtained by dispersing the orange fluorescent material 13 in, for example, translucent resin such as silicone resin and epoxy resin. A method for dispersing the orange fluorescent material 13 is not particularly limited and may be a conventional and publicly known one.

A ratio of mixing the fluorescent material to be dispersed is not particularly limited and may be determined appropriately so that white light in a neutral white region and a lamp color region is emitted.

For example, a weight ratio of the translucent resin to the orange fluorescent material 13 (weight of translucent resin/weight of orange fluorescent material 13) may be in a range of 2-20. Furthermore, a weight ratio of the green fluorescent material 14 to the orange fluorescent material 13 (weight of green fluorescent material 14/weight of orange fluorescent material 13) may be in a range of 0.01-2. That is, (weight of translucent resin/weight of green fluorescent material 14) may be in a range of 1-200.

(V) Others

In the light-emitting device 1 in accordance with the present embodiment, members other than the semiconductor light-emitting element 2, the orange fluorescent material 13, the green fluorescent material 14, and the mold resin 5, i.e. members such as the printed wiring substrate 3, the adhesive 10, and the metal wire 12 may be configured in the same manner as in the conventional art (e.g. Japanese Patent Application Publication No. 2003-321675, Japanese Patent Application Publication No. 2006-8721 etc.), and may be produced in the same manner as in the conventional art. The present invention described as above can be reworded as follows.

(1) A semiconductor light-emitting device for emitting white light, including at least a semiconductor light-emitting element for emitting blue light and an orange fluorescent material which absorbs the blue light so as to emit orange light, the orange fluorescent material being a Ce-activated $CaAlSiN_3$ fluorescent material in a solid solution crystal form in which Ce and oxygen are dissolved in a crystal having a composition of $cCaAlSiN_3.(1-c)LiSi_2N_3$ where $0.2 \leq c \leq 0.8$, and the orange fluorescent material containing Ce in a range of 2 weight % or more.

(2) The semiconductor light-emitting device as set forth in (1), wherein the maximum value of inner quantum efficiency of the orange fluorescent material is in a range of 450 nm to 470 nm.

(3) The semiconductor light-emitting device as set forth in (1), wherein the orange fluorescent material contains Li in a range of 4 weight % or less.

(4) The semiconductor light-emitting device as set forth in (1), wherein the orange fluorescent material contains Ce in a range of 6 weight % or less.

(5) The semiconductor light-emitting device as set forth in (1), further including a green fluorescent material in addition to the orange fluorescent material.

(6) The semiconductor light-emitting device as set forth in (5), wherein full width at half maximum of emission spectrum of the green fluorescent material is not more than 55 nm.

(7) The semiconductor light-emitting device as set forth in (5), wherein the green fluorescent material is an Eu-activated β sialon fluorescent material.

(8) The semiconductor light-emitting device as set forth in (7), wherein an absorption ratio of light of the Eu-activated β sialon fluorescent material at 600 nm is not more than 10%.

The present invention encompasses aspects as follows.

In order to solve the foregoing problem, a light-emitting device of the present invention is a light-emitting device for emitting white light, including at least a light-emitting element for emitting blue light, an orange fluorescent material which absorbs the blue light so as to emit orange light, and a green fluorescent material which absorbs the blue light so as to emit green light, the orange fluorescent material being a Ce-activated $CaAlSiN_3$ fluorescent material in a solid solution crystal form in which Ce and oxygen are dissolved in a crystal having a composition of $cCaAlSiN_3.(1-c)LiSi_2N_3$ where $0.2 \leq c \leq 0.8$, and the orange fluorescent material containing 2 weight % or more of Ce.

With arrangement, the orange fluorescent material is excited with high efficiency in a wavelength region of 440-470 nm where full width at half maximum of emission spectrum of the orange fluorescent material is broad and a light-emitting element such as LED that emits blue light exhibits high luminous efficiency in general. Accordingly, it is possible to realize a light-emitting device that emits, with high luminous efficiency, white light with high Ra and R9. Therefore, it is possible to provide a light-emitting device that emits, with high efficiency, white light with excellent color rendering index.

It is preferable to arrange the light-emitting device of the present invention such that excitation wavelength of the orange fluorescent material is in a range of 440 nm to 470 nm, the excitation wavelength being indicative of a maximum value of inner quantum efficiency.

With the arrangement, the orange fluorescent material is excited with high efficiency in a wavelength region where a light-emitting element such as LED that emits blue light exhibits high luminous efficiency. Accordingly, it is possible to realize a light-emitting device that emits, with high efficiency, light with higher color rendering index.

It is preferable to arrange the light-emitting device of the present invention such that the orange fluorescent material contains 4 weight % or less of Li.

With the arrangement, it is possible to realize a light-emitting device with higher luminous efficiency.

It is preferable to arrange the light-emitting device of the present invention such that the orange fluorescent material contains 6 weight % or less of Ce.

With the arrangement, it is possible to realize a light-emitting device with higher luminous efficiency and excellent temperature characteristics.

It is preferable to arrange the light-emitting device of the present invention such that full width at half maximum of emission spectrum of the orange fluorescent material is not less than 120 nm and not more than 150 nm.

With the arrangement, the full width at half maximum of the orange fluorescent material is broad, so that it is possible to realize a light-emitting device that emits light with high color rendering index and that exhibits high luminous efficiency.

It is preferable to arrange the light-emitting device of the present invention such that full width at half maximum of emission spectrum of the green fluorescent material is not more than 55 nm.

With the arrangement, it is possible to realize a light-emitting device that exhibits higher Ra and R9 and that emits white light with excellent color rendering index.

It is preferable to arrange the light-emitting device of the present invention such that the green fluorescent material is an Eu-activated oxynitride fluorescent material.

With the arrangement, since the Eu-activated oxynitride fluorescent material has high stability and excellent temperature characteristics, it is possible to realize a light-emitting device with excellent temperature characteristics.

It is preferable to arrange the light-emitting device of the present invention such that the green fluorescent material is an Eu-activated β sialon fluorescent material.

The Eu-activated β sialon fluorescent material is excited efficiently by blue light, and as a result of excitation by blue light, emits light with particularly narrow full width at half maximum of emission spectrum.

It is preferable to arrange the light-emitting device of the present invention such that an absorption ratio of light of the Eu-activated β sialon fluorescent material at 600 nm is not more than 10%.

With the arrangement, unnecessary absorption of orange light by the green fluorescent material is subdued, so that luminous efficiency of the light-emitting device increases.

The present invention is not limited to the description of the embodiments above, but may be altered by a skilled person within the scope of the claims. An embodiment based on a proper combination of technical means disclosed in different embodiments is encompassed in the technical scope of the present invention.

EXAMPLES

The following description will discuss the present invention in more detail with reference to Examples and Comparative Examples although the present invention is not limited to such examples.

[Excitation Spectrum and Emission Spectrum]

The excitation spectrum and emission spectrum of a fluorescent material were measured with the use of F-4500 (product name, manufactured by Hitachi, Ltd.). The excitation spectrum was measured by scanning the intensity of light emission at its emission peak. The emission spectrum was measured by exciting light which has a wavelength of 450 nm.

[Inner Quantum Efficiency]

The inner quantum efficiency of a fluorescent material powder was measured with the use of a measurement system in which a spectrometer (product name: MCPD-7000, manufactured by Otsuka Electronics Co. Ltd.) and an integrating sphere were used in combination.

[Li Concentration and Ce Concentration in Fluorescent Material Powder]

The Li concentration and Ce concentration in the fluorescent material powder were measured with the use of ICP (product name: IRIS Advantage, manufactured by Nippon Jarrell-Ash Co. Ltd.).

[Powder X-Ray Diffraction]

Powder X-ray diffraction (XRD) was carried out with the use of a Kα line of Cu.

Production of Fluorescent Material

Production Example 1-1

Production 1 of Orange Fluorescent Material

With a crystal of the $0.3CaAlSiN_3.0.7LiSi_2N_3$ composition as a host crystal, chemical synthesis was carried out in order to obtain a fluorescent material in which the host crystal is activated with Ce.

Specifically, in order to obtain a compound represented by a theoretical composition formula $Ce_{0.0033}Li_{0.1157}Ca_{0.0496}Al_{0.0496}Si_{0.281}O_{0.0050}N_{0.4959}$, raw powders of $Si_3N_4$, AlN, $Li_3N$, $Ca_3N_2$, and $CeO_2$ were weighed with the compositional ratios of 67.3 wt %, 10.4 wt %, 6.9 wt %, 12.5 wt %, 2.92 wt %, respectively, in such a manner that the entire weight was set to 2.0 g (in so doing, the Ce was prepared to take up 2.4 wt % of the raw powders), (ii) the raw materials thus weighed were mixed together for 10 minutes with the use of an agate pestle and a mortar, and then (iii) the mixture thus obtained was dropped in free fall into a pot made of boron nitride until the pot was filled with the mixture by 38% (of the volume filling ratio).

Note that all the steps involved in the weighing and mixing of the powders were carried out in a glove box capable of maintaining therein a nitrogen atmosphere in which the moisture content and the oxygen content are each 1 ppm or less.

Subsequently, in order for the mixture to be calcined, a boron-nitride pot containing the mixture was placed in an electric furnace with a graphite resistance heating system. The operation of calcination was carried out as follows: (i) inside of the electric furnace was vacuumized with the use of a diffusion pump, (ii) a temperature of the inside of the electric furnace was raised from a room temperature to 800° C. at speed of 1200° C. per hour, (iii) nitrogen with 99.999 volume % purity was introduced into the inside of the electric furnace so as to set the atmospheric pressure to 0.92 MPa, (iv) the temperature of the inside of the electric furnace was raised to 1800° C. at speed of 600° C. per hour, and then (v) the temperature of the inside of the electric furnace was maintained at 1800° C. for 2 hours.

Following the calcination, excess $Li_3N$ was removed from the calcined substance by water-rinsing. Then, the calcined substance thus processed was roughly crushed and then crushed by hands with the use of an aluminum mortar, so that a fluorescent material powder was obtained.

Note that the fluorescent material powder contained an oxide material as a raw powder, and was therefore in a solid solution crystal form in which Ce and oxygen were dissolved.

Table 2 shows the Ce concentration and the Li concentration of the fluorescent material powder which were obtained with the use of the ICP and compositions of individual fluorescent materials which were obtained from the Li concentration. Note that the Li concentration, which was lower than 4.09 wt % in the theoretical composition, is considered to be the result of Li evaporation during the calcination and of the water-rinsing after the calcination.

As a result of examining the fluorescent material powder with the use of powder X-ray diffraction (XRD), an XRD chart shown in FIG. 2 was obtained, and it was therefore confirmed that the fluorescent material powder possesses a crystalline structure in which a $CaAlSiN_3$ phase is a main phase. Additionally, as a result of radiating the fluorescent material powder with a lamp emitting light having a wavelength of 365 nm, it was confirmed that the fluorescent material powder emits orange light in such a condition.

Figure 3:
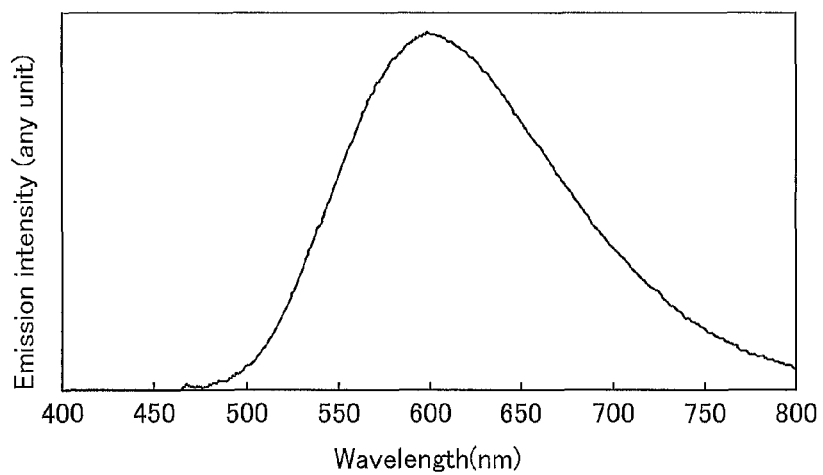
FIG. 3 is a graph showing emission spectrum of the fluorescent material powder obtained in Production Example 1-1.
Figure 4:
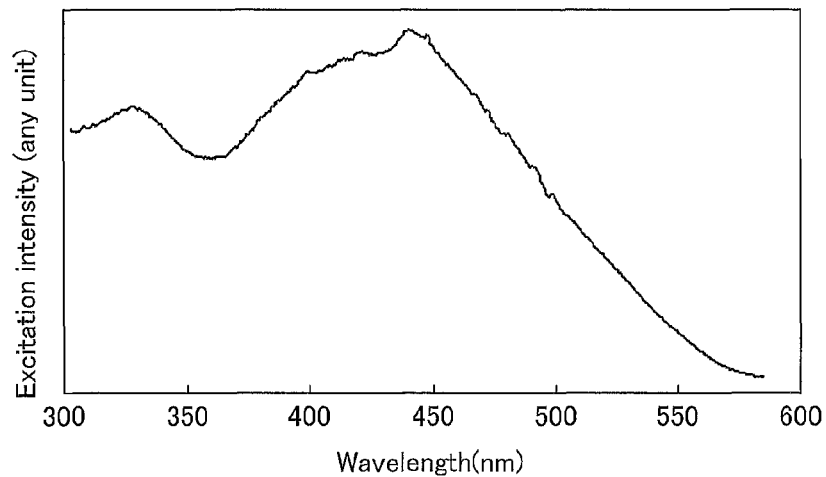
FIG. 4 is a graph showing excitation spectrum of the fluorescent material powder obtained in Production Example 1-1.

FIG. 3 is a graph showing the emission spectrum of the fluorescent material powder. The longitudinal and lateral axes of FIG. 3 represent emission intensity (any given unit) and wavelength (nm), respectively. FIG. 4 is a graph showing the excitation spectrum of the fluorescent material powder. The longitudinal and lateral axes of FIG. 4 represent excitation intensity (any given unit) and wavelength (nm), respectively.

Table 3 shows (i) chromaticity coordinates of, a peak wavelength of, and a full width at half maximum of the emission spectrum shown in FIG. 3 and (ii) an excitation wavelength indicative of the largest value of the inner quantum efficiency (maximum value of inner quantum efficiency) in the fluorescent material powder.

Production Example 1-2

Production 2 of Orange Fluorescent Material

With a crystal of the $0.3CaAlSiN_3.0.7LiSi_2N_3$ composition as a host crystal, chemical synthesis was carried out in order to obtain a fluorescent material in which the host cell is activated is activated with Ce.

Specifically, in order to obtain a compound represented by a theoretical composition formula, $Ce_{0.066}Li_{0.1148}Ca_{0.0492}Al_{0.0492}Si_{0.2787}O_{0.0098}N_{0.4918}$, operation identical to that of Production Example 1-1 was carried out except that the mixing ratios of $Si_3N_4$, AlN, $Li_3N$, $Ca_3N_2$, and $CeO_2$ were changed to values shown in Table 1. With this operation, a fluorescent material powder was obtained.

Note that (i) the Ce was prepared to take up 4.6 wt % of the raw powders and (ii) the fluorescent material powder contained an oxide material as raw material powder, and was therefore in a solid solution crystal form in which Ce and oxygen were dissolved.

Table 2 shows the Ce concentration and the Li concentration of the fluorescent material powder which were obtained with the use of the ICP and compositions of individual fluorescent materials which were obtained from the Li concentration. Note that the Li concentration, which was lower than 4.06 wt % in the theoretical composition, is considered to be the result of Li evaporation during the calcination and of water-rinsing after the calcination.

Figure 5:
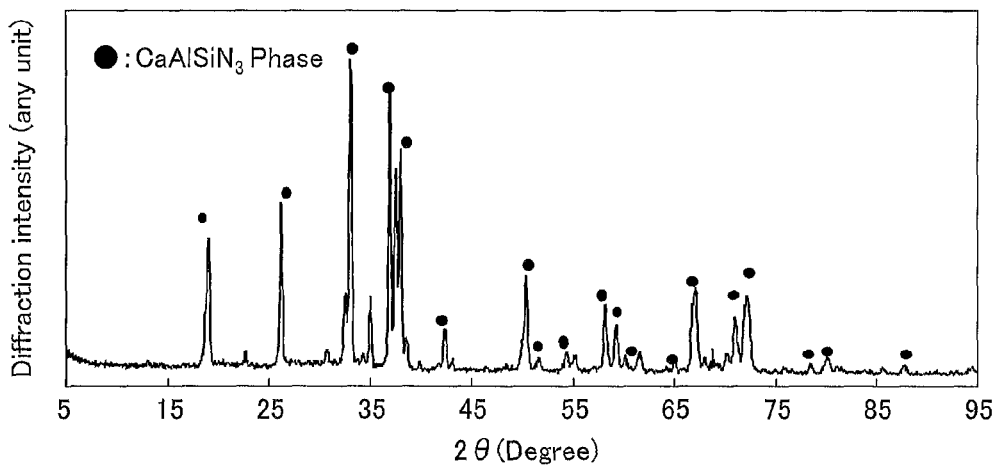
FIG. 5 is a graph showing a result of XRD measurement of a fluorescent material powder obtained in Production Example 1-2.

As a result of examining the fluorescent material powder with the use of powder X-ray diffraction (XRD), an XRD chart shown in FIG. 5 was obtained, and it was therefore confirmed that the fluorescent material powder possesses a crystalline structure in which a $CaAlSiN_3$ phase is a main phase. Additionally, as a result of radiating the fluorescent material powder with a lamp emitting light having a wavelength of 365 nm, it was confirmed that the fluorescent material powder emits orange light in such a condition.

Figure 6:
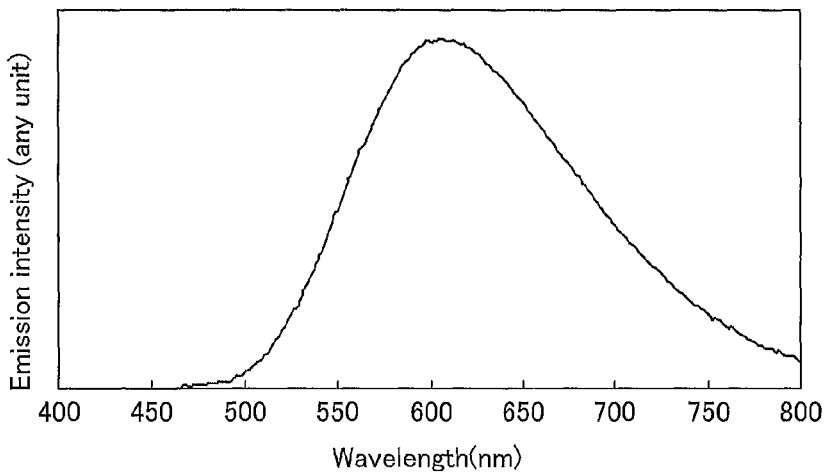
FIG. 6 is a graph showing emission spectrum of the fluorescent material powder obtained in Production Example 1-2.

FIG. 6 is a graph showing the emission spectrum of the fluorescent material powder. The longitudinal and lateral axes of FIG. 6 represent emission intensity (any given unit) and wavelength (nm), respectively. Table 3 shows (i) chromaticity coordinates of, a peak wavelength of, and full width at half maximum of the emission spectrum shown in FIG. 6 and (ii) an excitation wavelength indicative of the largest value of the inner quantum efficiency (maximum value of inner quantum efficiency) in the fluorescent material powder.

Figure 7:
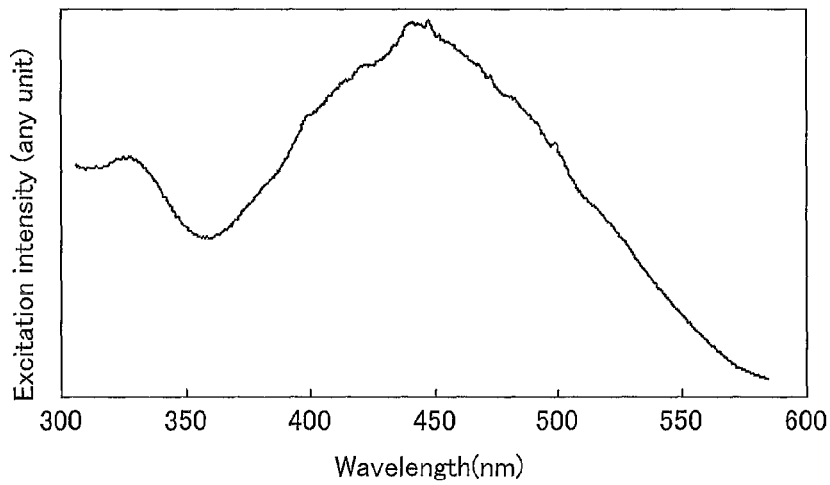
FIG. 7 is a graph showing excitation spectrum of the fluorescent material powder obtained in Production Example 1-2.

Moreover, FIG. 7 is a graph showing the excitation spectrum of the fluorescent material powder. The longitudinal and lateral axes of FIG. 7 represent excitation intensity (any given unit) and wavelength (nm), respectively.

Comparative Production Example 1

Production 3 of Orange Fluorescent Material

With a crystal of the $0.3CaAlSiN_3.0.7LiSi_2N_3$ composition as a host crystal, chemical synthesis was carried out in order to obtain a fluorescent material in which the host cell is activated with Ce.

Specifically, in order to obtain a compound represented by a theoretical composition formula, $Ce_{0.017}Li_{0.1162}Ca_{0.0498}Al_{0.0498}Si_{0.2822}O_{0.0025}N_{0.4979}$, operation identical to that of Production Example 1-1 was carried out except that the mixing ratios of $Si_3N_4$, AlN, $Li_3N$, $Ca_3N_2$, and $CeO_2$ were changed to values shown in Table 1. With this operation, a fluorescent material powder was obtained. Note that (i) the Ce was prepared to take up 1.2 wt % of the raw powders and (ii) the fluorescent material powder contained an oxide material as raw material powder, and was therefore in a solid solution crystal form in which Ce and oxygen were dissolved.

Table 2 shows (i) the Ce and Li concentrations of the fluorescent material powder which were obtained with the use of the ICP and (ii) compositions of individual fluorescent materials which were obtained from the Li concentration. Note that the Li concentration, which was lower than 4.17 wt % in the theoretical composition, is considered to be the result of Li evaporation during the calcination and of water-rinsing after the calcination.

As a result of examining the fluorescent material powder with the use of powder X-ray diffraction (XRD), it was confirmed that the fluorescent material powder possesses a crystalline structure in which a $CaAlSiN_3$ phase is a main phase. Additionally, as a result of radiating the fluorescent material powder with a lamp emitting light having a wavelength of 365 nm, it was confirmed that the fluorescent material powder emits orange light in such a condition.

Figure 8:
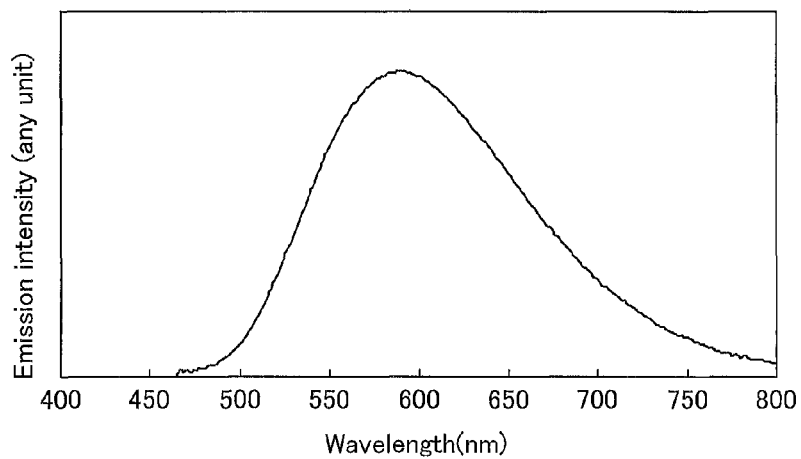
FIG. 8 is a graph showing emission spectrum of the fluorescent material powder obtained in Comparative Production Example 1.

FIG. 8 is a graph showing the emission spectrum of the fluorescent material powder. The longitudinal and lateral axes of FIG. 8 represent emission intensity (any given unit) and wavelength (nm), respectively. Table 3 shows (i) chromaticity coordinates of, a peak wavelength of, and full width at half maximum of the emission spectrum shown in FIG. 8 and (ii) an excitation wavelength indicative of the largest value of the inner quantum efficiency (maximum value of inner quantum efficiency) in the fluorescent material powder.

Figure 9:
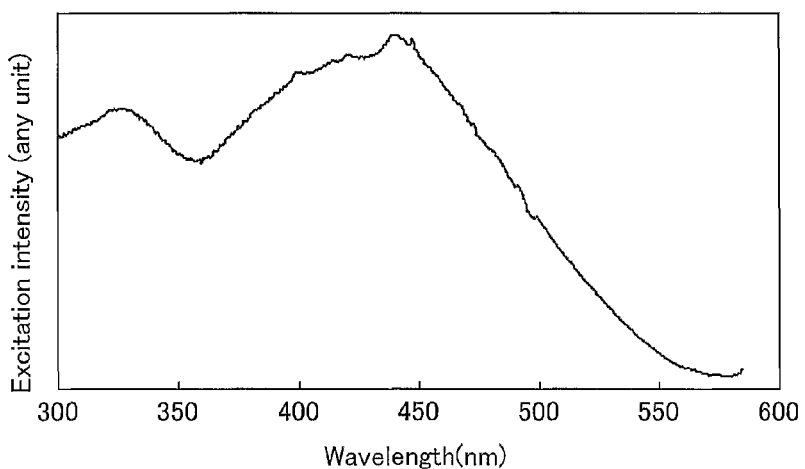
FIG. 9 is a graph showing excitation spectrum of the fluorescent material powder obtained in Comparative Production Example 1.

Moreover, FIG. 9 is a graph showing the excitation spectrum of the fluorescent material powder. The longitudinal and lateral axes of FIG. 9 represent excitation intensity (any given unit) and wavelength (nm), respectively.

Figure 10:
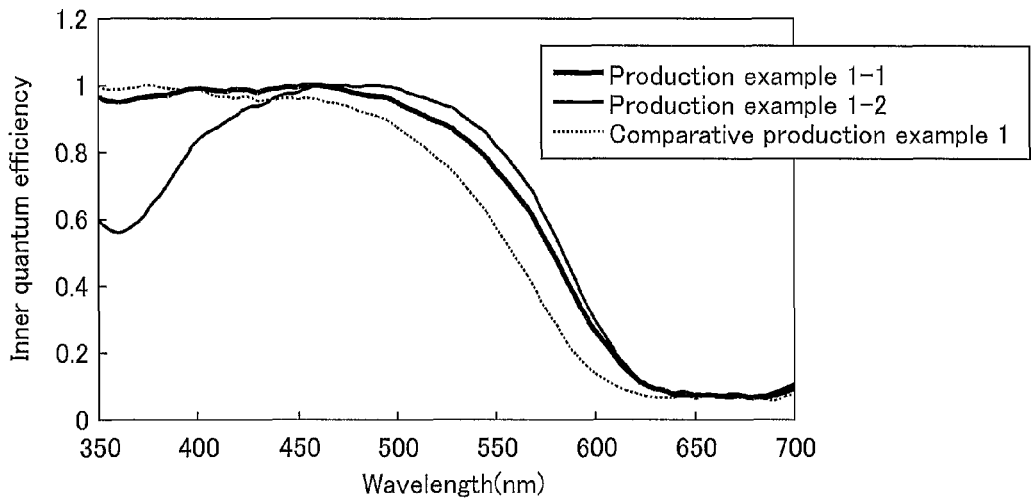
FIG. 10 is a graph showing excitation-wavelength-dependency of inner quantum efficiency of a fluorescent material powder.

FIG. 10 shows a graph indicative of excitation-wavelength-dependency of inner quantum efficiency of each of the fluorescent material powders produced in Production Example 1-1, Production Example 1-2, and in Comparative Production Example 1. As shown in FIG. 10, the fluorescent material powders described in Production Examples 1-1 and 1-2 each show especially high inner quantum efficiency in a wavelength range of 440 nm through 470 nm where a blue LED shows high luminous efficiency, which indicates that the fluorescent material powders are suitable for fluorescent materials for exciting blue LEDs. This is due to the fact that each of the fluorescent material powders described in Productions Examples 1-1 and 1-2 (i) is a Ce-activated $CaAlSiN_3$ fluorescent material, (ii) is a solution crystal in which Ce and oxygen are dissolved in a crystal having a composition of $cCaAlSiN_3 \cdot (1-c)LiSi_2N_3$ where $0.2 \leq c \leq 0.8$, and (iii) contains Ce in a range of 2 wt % or more.

Production Example 1-3

Comparative Production

Examples 2 Through 7

Productions 4 Through 10 of Orange Fluorescent Materials

By carrying out an operation identical to that of Production Example 1-1 except that the mixing ratios of $Si_3N_4$, AlN, $Li_3N$, $Ca_3N_2$, and $CeO_2$ were changed to values shown in Table 1, there were synthesized solid solution crystals in each of which (i) Ce and oxygen were dissolved and (ii) Ce and Li concentrations were changed. Table 2 shows (a) the Ce and Li concentrations of the respective fluorescent materials obtained with the use of the ICP and (b) compositions of the respective fluorescent materials obtained from the respective Li concentrations.

Note that each of the fluorescent material powders contained an oxide material as a raw material powder, and was therefore an orange fluorescent material in a solid solution crystal form in which Ce and oxygen were dissolved.

Figure 11:
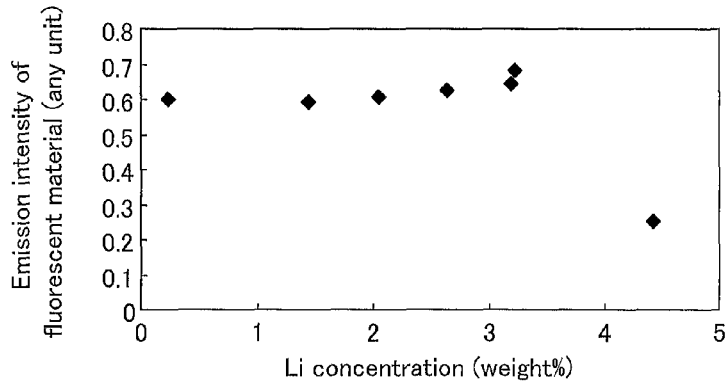
FIG. 11 is a graph showing Li-concentration-dependency of emission intensity of each of solid solution crystals in which Ce and oxygen are dissolved.

FIG. 11 is a graph showing Li-concentration-dependency of emission intensity of each of the orange fluorescent materials thus obtained. As shown in FIG. 11, an orange fluorescent material having an Li concentration of 4 wt % or less has tendency to show a high emission intensity. The phenomenon that Ce and Li concentrations in a solid solution crystal which deviate from the range mentioned above causes lowering of emission intensity is considered to result from too low concentrations of elements that contribute to light emission, generation of the hetero-phase, etc.

Figure 12:
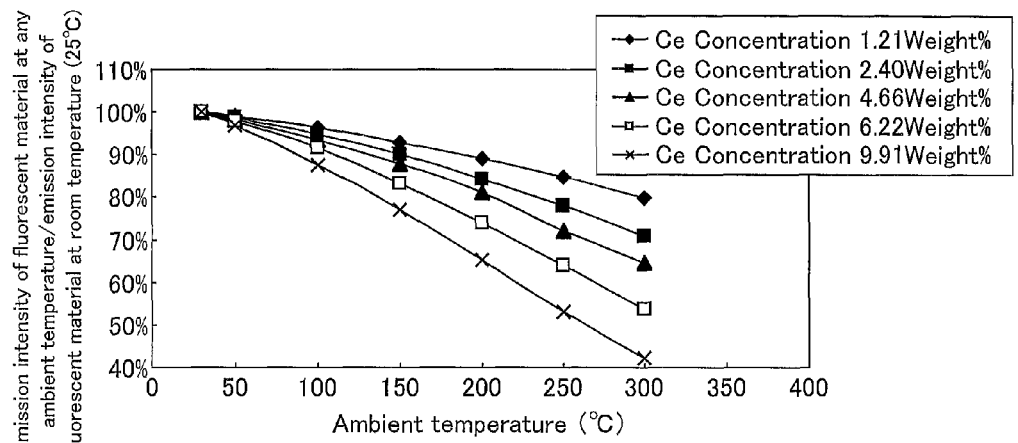
FIG. 12 is a graph indicative of ambient-temperature-dependency of emission intensity of each of orange fluorescent materials when excited by light having a wavelength of 450 nm.
Figure 13:
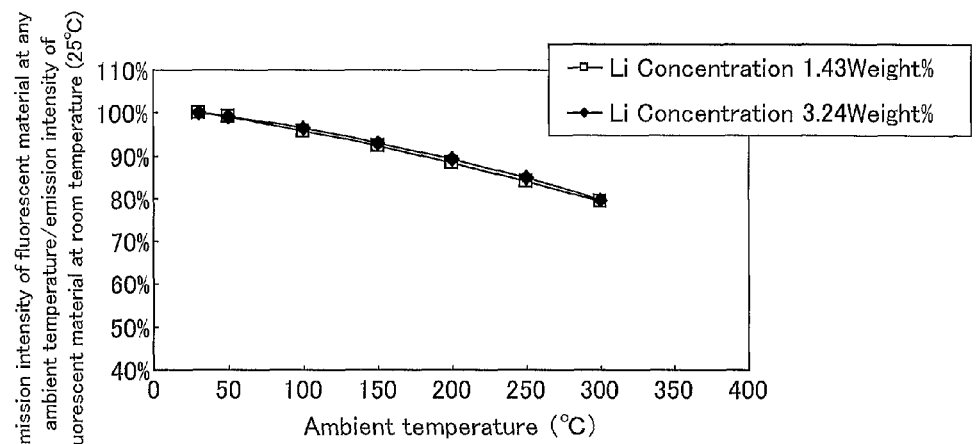
FIG. 13 is a graph showing ambient-temperature-dependency of emission intensity of each of orange fluorescent materials when excited by light having a wavelength of 450 nm.

FIGS. 12 and 13 each show a graph indicative of ambient-temperature-dependency of emission intensity of each of the orange fluorescent materials thus obtained when excited by light having a wavelength of 450 nm. It is found from FIGS. 12 and 13 that the emission intensities in a high-temperature environment do not decrease despite an increase in Li concentrations in the orange fluorescent materials, whereas the emission intensities in the high-temperature environment tend to decrease in a case where Ce concentrations increase, and that a Ce concentration in each of the orange fluorescent materials is preferably 6 wt % or less. Furthermore, it is found that there is no particular limitation on an Li concentration in terms of emission intensity of light emitted from the orange fluorescent material in a high-temperature environment.

Figure 14:
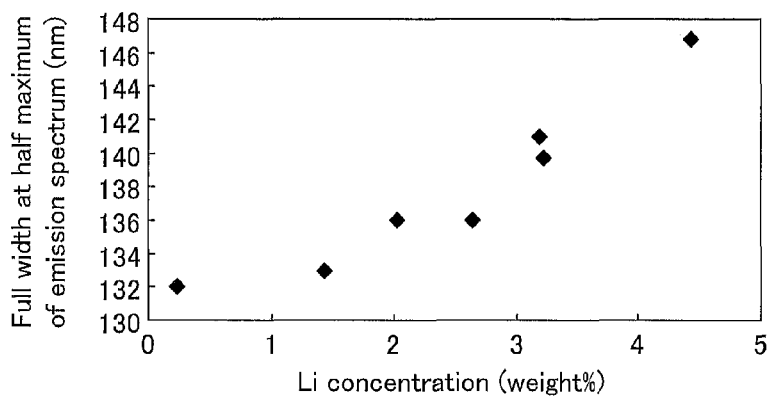
FIG. 14 is a graph showing Li-concentration-dependency of full width at half maximum of emission spectrum of each of orange fluorescent materials when excited by light having a wavelength of 450 nm.

FIG. 14 shows Li-concentration-dependency of full width at half maximum of emission spectrum of each of the orange fluorescent materials when excited by light having a wavelength of 450 nm. It is found from FIG. 14 that the full width at half maximum of the emission spectrum increases particularly in a case where the Li concentration is 1.5 wt % or more.

Note that the emission intensities described in Production Example 1-3 and in Comparative Examples 2 through 7 were measured with the use of a device in which an MCPD-7000 (manufactured by Otsuka Electronics Co. Ltd.) and an integrating sphere were used in combination.

TABLE 1

| | Mixing ratio of raw material powder (weight %) | | | | |
|---|---|---|---|---|---|
| | $CeO_2$ | $Li_3N$ | $Ca_3N_2$ | AlN | $Si_3N_4$ |
| Production Example 1-1 | 2.92 | 6.90 | 12.50 | 10.40 | 67.30 |
| Production Example 1-2 | 5.66 | 6.70 | 12.20 | 10.10 | 65.40 |
| Production Example 1-3 | 3.07 | 9.35 | 4.41 | 3.66 | 79.50 |
| Comparative Production Example 2 | 1.30 | 1.75 | 29.84 | 24.75 | 42.36 |
| Comparative Production Example 3 | 1.37 | 3.68 | 23.52 | 19.51 | 51.93 |
| Comparative Production Example 4 | 1.40 | 4.72 | 20.11 | 16.68 | 57.09 |
| Comparative Production Example 5 | 1.44 | 5.82 | 16.51 | 13.70 | 62.53 |
| Comparative Production Example 6 | 7.59 | 1.28 | 25.41 | 21.07 | 44.65 |
| Comparative Production Example 7 | 12.03 | 1.22 | 24.18 | 20.06 | 42.50 |

TABLE 2

| | Result of ICP measurement | | Composition of |
|---|---|---|---|
| | Li weight % | Ce weight % | fluorescent material |
| Production Example 1-1 | 3.23 | 2.40 | $0.45CaAlSiN_3 \cdot 0.55LiSi_2N_3$ |
| Production Example 1-2 | 3.19 | 4.66 | $0.46CaAlSiN_3 \cdot 0.54LiSi_2N_3$ |
| Production Example 1-3 | 4.43 | 2.53 | $0.25CaAlSiN_3 \cdot 0.75LiSi_2N_3$ |
| Comparative Production Example 1 | 3.24 | 1.21 | $0.35CaAlSiN_3 \cdot 0.65LiSi_2N_3$ |
| Comparative Production Example 2 | 0.23 | 1.07 | $0.96CaAlSiN_3 \cdot 0.04LiSi_2N_3$ |
| Comparative Production Example 3 | 1.43 | 1.12 | $0.76CaAlSiN_3 \cdot 0.24LiSi_2N_3$ |
| Comparative Production Example 4 | 2.04 | 1.15 | $0.65CaAlSiN_3 \cdot 0.35LiSi_2N_3$ |
| Comparative Production Example 5 | 2.64 | 1.18 | $0.55CaAlSiN_3 \cdot 0.45LiSi_2N_3$ |
| Comparative Production Example 6 | 0.20 | 6.22 | $0.97CaAlSiN_3 \cdot 0.03LiSi_2N_3$ |
| Comparative Production Example 7 | 0.21 | 9.91 | $0.97CaAlSiN_3 \cdot 0.03LiSi_2N_3$ |

TABLE 3

| | Peak wavelength (nm) | Full width at half maximum of emission spectrum (nm) | u' | v' | Maximum value of inner quantum efficiency (nm) |
|---|---|---|---|---|---|
| Production Example 1-1 | 600 | 142 | 0.282 | 0.556 | 455 |
| Production Example 1-2 | 606 | 146 | 0.297 | 0.554 | 465 |
| Comparative Production Example 1 | 591 | 139 | 0.259 | 0.558 | 375 |

Production Example 2

Preparation 1 of Eu-Activated β-Sialon Fluorescent Material

In order to obtain an Eu-activated β-sialon fluorescent material in which a fluorescent material represented by a composition formula $Si_{6-z'}Al_{z'}O_{z'}N_{8-z'}$, where z'=0.23 is activated with 0.09 at. % of Eu, powders of α-silicon nitride, aluminum nitride, and europium oxide were weighed with the compositional ratio of 95.82 wt %:3.37 wt %:0.81 wt %, respectively, and the powders thus weighed were mixed for 10 minutes or more with the use of a mortar and a pestle each made of a silicon nitride sintered compact, so that a powder aggregate was obtained. The powder aggregate was dropped in free fall into a boron-nitride pot of 20 mm in both diameter and height.

Next, the pot was placed in a pressurized electric furnace with a graphite resistance heating system. Then, inside of the electric furnace was vacuumized with the use of a diffusion pump, a temperature of the inside of the electric furnace was raised from a room temperature to 800° C. at speed of 500° C. per hour, nitrogen with 99.999 volume % purity was introduced into the inside of the electric furnace so as to set the atmospheric pressure there to 1 MPa, the temperature of the inside of the electric furnace was raised to 1900° C. at speed of 500° C. per hour, and the temperature of the inside of the electric furnace was maintained at 1900° C. for 8 hours, so that a calcined powder sample was obtained. The calcined powder sample thus obtained was crushed in an agate mortar and then again dropped in free fall into a boron-nitride pot and then the pot was subjected to an argon atmosphere with standard atmospheric pressure at a temperature of 1450° C. for 8 hours, so that a fluorescent material sample was obtained. The fluorescent material sample thus obtained was crushed in an agate mortar and then subjected to a 1:1 mixed acid consisting of 50% of hydrofluoric acid and 70% of nitric acid, so that a fluorescent material powder was obtained.

Figure 15:
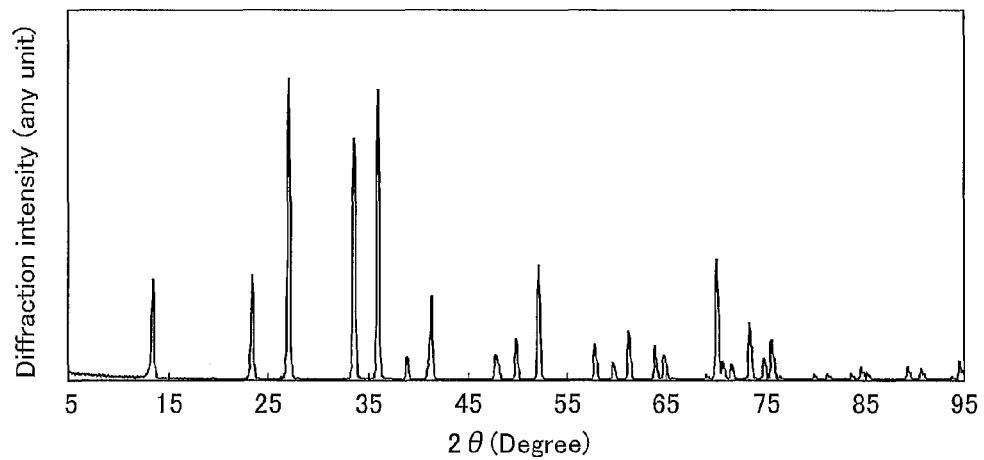
FIG. 15 is a graph showing a result of XRD measurement of a fluorescent material powder obtained in Production Example 2.

As a result of examining the fluorescent material powder with the use of powder X-ray diffraction (XRD), an XRD chart shown in FIG. 15 was obtained, all of which chart indicate that the fluorescent material powder possesses a β-sialon structure. Furthermore, as a result of radiating the fluorescent material powder with light having a wavelength of 365 nm, it was confirmed that the fluorescent material powder emits green light in such a condition.

Figure 16:
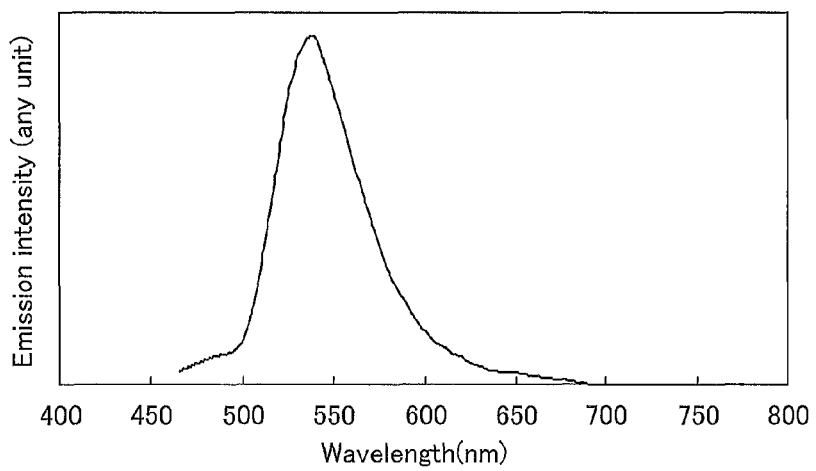
FIG. 16 is a graph showing emission spectrum of the fluorescent material powder obtained in Production Example 2.
Figure 17:
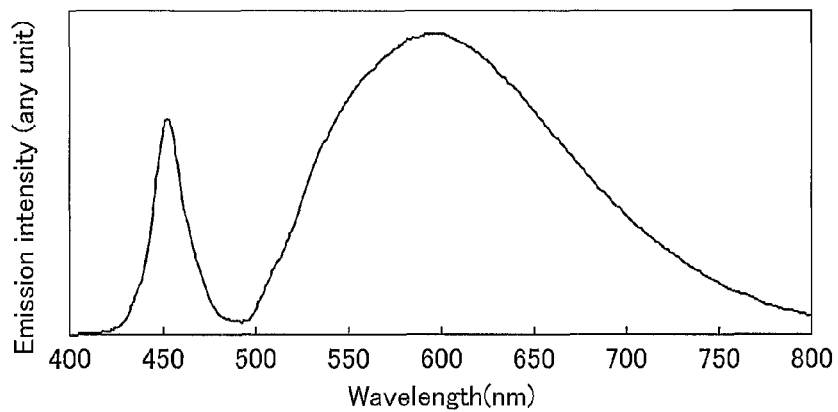
FIG. 17 is a graph showing emission spectrum of a light-emitting device produced in Example 1.
Figure 18:
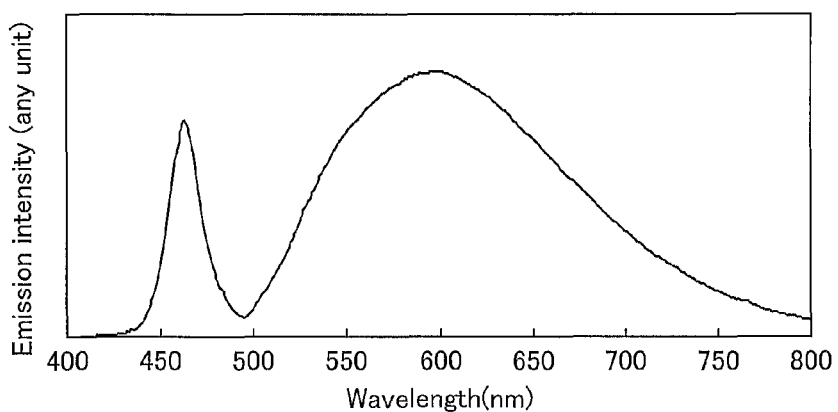
FIG. 18 is a graph showing emission spectrum of a light-emitting device produced in Example 2.
Figure 19:
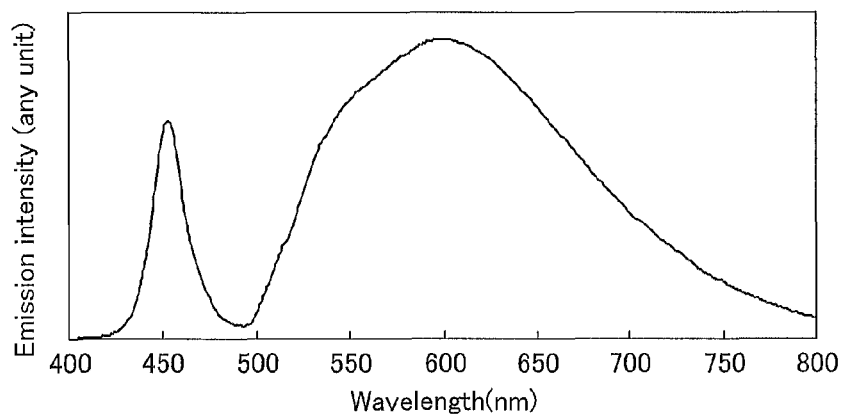
FIG. 19 is a graph showing emission spectrum of a light-emitting device produced in Example 3.
Figure 20:
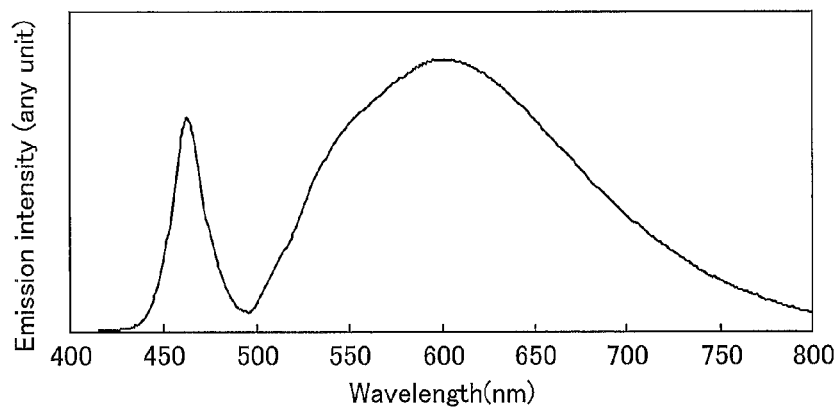
FIG. 20 is a graph showing emission spectrum of a light-emitting device produced in Example 4.

As a result of measuring the emission spectrum of the Eu-activated β-sialon fluorescent material powder thus obtained, an emission spectrum shown in FIG. 16 was obtained. The longitudinal and lateral axes of FIG. 16 represent emission intensity (any given unit) and wavelength (nm), respectively. In FIG. 16, chromaticity coordinates of the emission spectrum were (u', v')=(0.130, 0.568), a peak wavelength of the emission spectrum was 541 nm, and full width at half maximum of the emission spectrum was 54 nm.

As a result of measuring an oxygen amount in the synthesized powder with the use of an oxygen/nitrogen analyzer based on a combustion method (TC 436 model, manufactured by LECO Corporation), the oxygen content was 1.12 wt %. As a result of measuring an absorption factor of light having a wavelength of 600 nm with the use of an MCPD-7000 (manufactured by Otsuka Electronics Co. Ltd.), the absorption factor was 8.1%.

Preparation of Semiconductor Light-Emitting Device

Examples 1-4

The orange fluorescent material and the green fluorescent material shown in Table 4 were each mixed with silicone resin (product name: KER2500, Shin-Etsu Silicone) with the weight ratios shown in Table 5, so that mold resin in which the orange fluorescent material was dispersed and mold resin in which the green fluorescent material was dispersed were prepared. Next, a resin frame was filled with the mold resin in which the orange fluorescent resin was dispersed and then filled with the mold resin in which the green fluorescent material was dispersed, so that semiconductor light-emitting devices having the structure shown in FIG. 1 in accordance with Examples 1-4 were manufactured.

The semiconductor light-emitting element used here was an LED having an emission peak wavelength shown in Table 4 (product name: EZR, Cree, Inc.).

Here, the mixing ratios of the mold resins and the peak wavelength of the LED were controlled so that the correlated color temperatures of the individual light-emitting devices were approximately 3,000K. FIGS. 17-20 show emission spectra of the semiconductor light-emitting devices produced in Examples 1-4, and Table 6 shows characteristics of the semiconductor light-emitting devices. In FIGS. 17-20, the longitudinal and lateral axes indicate emission intensity (any unit) and wavelength (nm), respectively. In Table 6, TCP indicates correlated color temperature (unit: K), Duv indicates deviation, and u' and v' indicate color coordinates.

The light-emitting device of the present invention is designed such that when the light-emitting element that emits blue light emits blue light to the orange fluorescent material and the green fluorescent material, white light is emitted. In Examples 1-4, when the LED emitted, to the orange fluorescent material and the green fluorescent material, blue light whose emission spectrum peak was at the wavelength shown in Table 4, white light with emission spectra shown in FIGS. 17-20, respectively, was emitted.

Comparative Examples 1 and 2

The orange fluorescent material and the green fluorescent material shown in Table 4 were each mixed with silicone resin (product name: KER2500, Shin-Etsu Silicone) with the weight ratios shown in Table 5, so that mold resin in which the orange fluorescent material was dispersed and mold resin in which the green fluorescent material was dispersed were prepared. Next, a resin frame was filled with the mold resin in which the orange fluorescent resin was dispersed and then filled with the mold resin in which the green fluorescent material was dispersed, so that semiconductor light-emitting devices having the structure shown in FIG. 1 in accordance with Comparative Examples 1 and 2 were manufactured.

The semiconductor light-emitting element used here was an LED having an emission peak wavelength shown in Table 4 (product name: EZR, Cree, Inc.).

Figure 21:
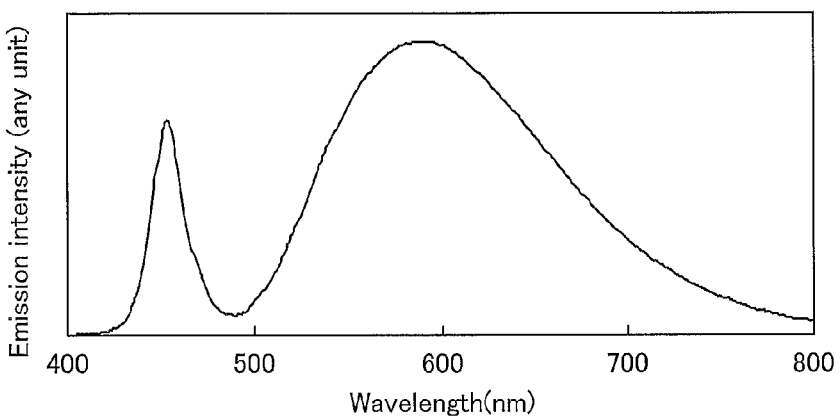
FIG. 21 is a graph showing emission spectrum of a light-emitting device produced in Comparative Example 1.
Figure 22:
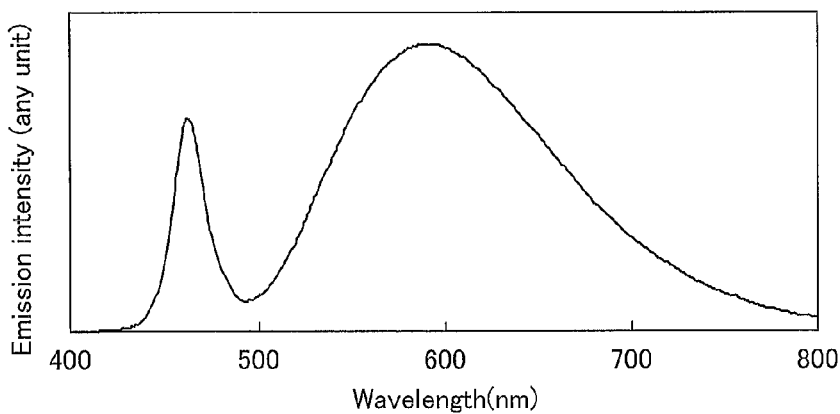
FIG. 22 is a graph showing emission spectrum of a light-emitting device produced in Comparative Example 2.

Here, the mixing ratios of the mold resins and the peak wavelength of the LED were controlled so that the correlated color temperatures of the individual light-emitting devices were approximately 3,000K. FIGS. 21 and 22 show emission spectra of the semiconductor light-emitting devices produced in Comparative Examples 1 and 2, and Table 6 shows characteristics of the semiconductor light-emitting devices. In FIGS. 21 and 22, the longitudinal and lateral axes indicate emission intensity (any unit) and wavelength (nm), respectively.

TABLE 4

| | LED peak wavelength (nm) | Orange fluorescent material | Green fluorescent material |
|---|---|---|---|
| Example 1 | 450 | Production Example 1-1 | Production Example 2 |
| Example 2 | 460 | Production Example 1-1 | Production Example 2 |
| Example 3 | 450 | Production Example 1-2 | Production Example 2 |
| Example 4 | 450 | Production Example 1-2 | Production Example 2 |
| Comparative Example 1 | 450 | Comparative Production Example 1 | Production Example 2 |
| Comparative Example 2 | 460 | Comparative Production Example 1 | Production Example 2 |

TABLE 5

| | Weight ratio of resin/green fluorescent material | Weight ratio of resin/orange fluorescent material |
|---|---|---|
| Example 1 | 23.04 | 9.61 |
| Example 2 | 26.98 | 9.97 |
| Example 3 | 18.47 | 9.68 |
| Example 4 | 20.89 | 9.88 |
| Comparative Example 1 | 200.27 | 9.13 |
| Comparative Example 2 | 333.33 | 9.13 |

TABLE 6

| | Ra | R9 | TCP | Duv | u' | v' | Relative luminous efficiency of LED (%) |
|---|---|---|---|---|---|---|---|
| Example 1 | 72.8 | 2.9 | 2993.8 | 0.4 | 0.251 | 0.522 | 100.0 |
| Example 2 | 76.0 | 8.9 | 3032.5 | 0.4 | 0.249 | 0.521 | 101.2 |
| Example 3 | 75.1 | 12.0 | 3025.9 | 0.9 | 0.249 | 0.522 | 98.1 |
| Example 4 | 78.2 | 17.0 | 3002.8 | 0.7 | 0.250 | 0.522 | 98.8 |
| Comparative Example 1 | 70.5 | −9.8 | 3067.9 | 0.7 | 0.248 | 0.521 | 95.5 |
| Comparative Example 2 | 72.7 | −6.5 | 3006.7 | 1.4 | 0.250 | 0.523 | 92.8 |

The emission spectra of the semiconductor light-emitting devices that were shown in FIGS. 17-22 were measured by a spectrophotometer (product name: MCPD-7000, manufactured by Otsuka Electronics Co. Ltd.), and indices shown in Table 6 were calculated based on the emission spectra thus measured. Luminous efficiencies (luminous intensity) of the semiconductor light-emitting devices were measured by a measurement system in which a spectrophotometer (product name: MCPD-7000, manufactured by Otsuka Electronics Co. Ltd.) was combined with an integrating sphere.

Next, with reference to Table 6, emission characteristics of the light-emitting devices are compared with each other. Focusing on luminous efficiency (luminous intensity), it is found that the light-emitting devices of Examples 1-4 exhibit higher luminous efficiency (luminous intensity) than the light-emitting devices of Comparative Examples 1 and 2. This is because the light-emitting devices of Examples 1-4 have higher inner quantum efficiency of fluorescent materials at an emission wavelength region of blue LED.

Next, light-emitting devices having the same configuration of fluorescent materials and different peak wavelengths of LEDs are compared with each other. The result shows that the light-emitting device of Example 2 whose LED peak wavelength is 460 nm has higher color rendering index than the light-emitting device of Example 1 whose LED peak wavelength is 450 nm. The orange fluorescent material used in the present Examples exhibits the maximum value of the inner quantum efficiency in a range of 440 nm to 470 nm, and accordingly the light-emitting devices of the present examples are superior in terms of compatibility between high color rendering index and luminous efficiency.

The embodiments and concrete examples of implementation discussed in the foregoing detailed explanation serve solely to illustrate the technical details of the present invention, which should not be narrowly interpreted within the limits of such embodiments and concrete examples. The scope of the present invention is not shown by the explanations above but by the scope of claims set forth below, and the present invention is intended to include all variations equivalent in their meanings and scopes to the scope of claims.

INDUSTRIAL APPLICABILITY

The light-emitting device of the present invention exhibits high luminous efficiency and emits white light with high Ra and R9. Accordingly, the light-emitting device of the present invention can be used appropriately for various illumination instruments such as home illumination instruments, medical illumination instruments, and vehicle lighting appliances.

REFERENCE SIGNS LIST

1 Light-emitting device
2 Semiconductor light-emitting element (light-emitting element)
3 Printed wiring substrate
4 Resin frame
5 Mold resin
6 InGaN layer
7 p-side electrode
8 n-side electrode
9 n-electrode section
10 Adhesive
11 p-electrode section
12 Metal wire
13 Orange fluorescent material
14 Green fluorescent material

The invention claimed is:

1. A light-emitting device for emitting white light, comprising at least a light-emitting element for emitting blue light, an orange fluorescent material which absorbs the blue light so as to emit orange light, and a green fluorescent material which absorbs the blue light so as to emit green light,
the orange fluorescent material being a Ce-activated $CaAlSiN_3$ fluorescent material in a solid solution crystal form in which Ce and oxygen are dissolved in a crystal having a composition of $cCaAlSiN_3 \cdot (1-c)LiSi_2N_3$ where $0.2 \leq c \leq 0.8$, and
the orange fluorescent material containing 2 weight % or more of Ce.

2. The light-emitting device as set forth in claim 1, wherein excitation wavelength of the orange fluorescent material is in a range of 440 nm to 470 nm, the excitation wavelength being indicative of a maximum value of inner quantum efficiency.

3. The light-emitting device as set forth in claim 1, wherein the orange fluorescent material contains 4 weight % or less of Li.

4. The light-emitting device as set forth in claim 1, wherein the orange fluorescent material contains 6 weight % or less of Ce.

5. The light-emitting device as set forth in claim 1, wherein full width at half maximum of emission spectrum of the orange fluorescent material is not less than 120 nm and not more than 150 nm.

6. The light-emitting device as set forth in claim 1, wherein full width at half maximum of emission spectrum of the green fluorescent material is not more than 55 nm.

7. The light-emitting device as set forth in claim 1, wherein the green fluorescent material is an Eu-activated oxynitride fluorescent material.

8. The light-emitting device as set forth in claim 1, wherein the green fluorescent material is an Eu-activated β sialon fluorescent material.

9. The light-emitting device as set forth in claim 8, wherein an absorption ratio of light of the Eu-activated β sialon fluorescent material at 600 nm is not more than 10%.

* * * * *